(12) United States Patent
Dhori et al.

(10) Patent No.: US 9,685,209 B1
(45) Date of Patent: Jun. 20, 2017

(54) CIRCUIT FOR GENERATING A SENSE AMPLIFIER ENABLE SIGNAL WITH VARIABLE TIMING

(71) Applicant: STMicroelectronics International N.V., Amsterdam (NL)

(72) Inventors: Kedar Janardan Dhori, Ghaziabad (IN); Vinay Kumar, Aligarh (IN); Ashish Kumar, Ranchi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 15/132,388

(22) Filed: Apr. 19, 2016

(51) Int. Cl.
 G11C 7/00 (2006.01)
 G11C 7/12 (2006.01)
 G11C 7/14 (2006.01)
 G11C 7/06 (2006.01)

(52) U.S. Cl.
 CPC ............. G11C 7/12 (2013.01); G11C 7/062 (2013.01); G11C 7/14 (2013.01)

(58) Field of Classification Search
 CPC .. G11C 7/08; G11C 7/227; G11C 7/06; G11C 11/419; G11C 7/22; G11C 29/02; G11C 7/12; G11C 7/14; G11C 8/08; G11C 2207/065; G11C 7/065; G11C 11/41; G11C 2207/2254; G11C 29/028; G11C 7/1045; G11C 11/4091; G11C 11/413
 USPC ............ 365/205, 210.1, 203, 154, 194, 207, 365/230.06, 185.2, 185.21, 189.07, 365/189.11, 196, 201, 208, 210.12, 233.1, 365/156, 185.33
 See application file for complete search history.

(56) References Cited

U.S. PATENT DOCUMENTS

| 6,738,296 B2 | 5/2004 | Sung et al. |
| 2013/0155758 A1* | 6/2013 | Liu ................... G11C 7/065 365/154 |
| 2015/0092502 A1 | 4/2015 | Yang et al. |

OTHER PUBLICATIONS

Heald, Raymond et al: "Variability in Sub-100nm SRAM Designs," Sun Microsystems, Inc., 2004 IEEE, pp. 347-352.

* cited by examiner

*Primary Examiner* — Thong Q Le
(74) *Attorney, Agent, or Firm* — Gardere Wynne Sewell LLP

(57) ABSTRACT

A sense amplifier enable signal generating circuit includes an input coupled to a dummy bit line of a memory. A voltage comparator circuit compares a voltage on the dummy bit line to a threshold voltage and generates an output signal when the voltage falls below that threshold voltage. A multi-bit counter circuit counts a count value in response to the output signal. A pull-up circuit pulls up the voltage on the dummy bit line in response to the output signal. A count comparator circuit compares the count value to a count threshold and generates a sense amplifier enable signal when the count value equals the count threshold.

29 Claims, 3 Drawing Sheets

CIRCUIT FOR GENERATING A SENSE AMPLIFIER ENABLE SIGNAL WITH VARIABLE TIMING

TECHNICAL FIELD

The present invention relates to an integrated memory circuit and in particular to a circuit operating to generate a sense amplifier enable signal for such an integrated memory circuit.

BACKGROUND

It is known in the art to operate an integrated memory circuit (such as an SRAM) at a plurality of supply voltages. For example, an integrated memory circuit may be supplied with a relatively high supply voltage (for example, 1.26V) in one mode of operation and further supplied with a relatively low supply voltage (for example, 0.6V) in another mode of operation.

In a typical integrated memory circuit, a sense amplifier coupled to the bit line(s) of a memory column is enabled for operation in response to a sense amplifier enable (SAEN) signal. The SAEN signal is generated by a sense amplifier enable generator circuit that implements a delay of sufficient time after selection of the memory cell (bitcell) to permit the data signals on the bit lines to fully develop before the sense amplifier is activated to sense those data signals. The amount of time needed to ensure that the data signals on the bit lines have fully developed varies as a function of the supply voltage for the integrated memory circuit. For example, the required amount of time is relatively longer for relatively lower supply voltages as the worst memory cell (bitcell) degrades heavily with low voltage and tracking it needs a long amount of time at low supply voltage.

Reference is now made to FIG. 1 showing a block diagram for a prior art self-timing solution for a sense amplifier enable generator circuit 10 used within an integrated memory circuit 12. The circuit 12 includes a memory array 14 formed by a plurality of rows and columns. The columns include a plurality of columns in an active portion 16 of the array 14 as well as at least one column in a dummy portion 18 of the array. In the active portion 16, each column is defined by a pair of bit lines that are complementary and noted as bit line BL and bit line bar BLB, with a memory cell 20 coupled between the pair of bit lines BL, BLB at each row location and driven a corresponding word line WL. In the dummy portion 18, each column is defined by at least one bit line noted as dummy bit line DBL, with a dummy memory cell 22 coupled to the dummy bit line DBL at each row location and driven by a dummy word line DWL.

Although multiple cells 20 and 22 are shown for single column, the illustration of FIG. 1 is simplified to explicitly show only the word line WL for one row with the corresponding memory cell 20 (in one column) for that row and only the dummy word line DWL for one row with the corresponding dummy memory cell 22 (in another column) for that row. The word lines WL and DWL are driven by a row decoder circuit 26 which operates to decode an address ADD and select, based on the decoded address, one word line WL for actuation. The dummy word line DWL is simultaneously activated with the activation of any address selected word line WL.

A sense amplifier circuit 30 is coupled to the plurality of pairs of bit lines through a column multiplexing circuit 32. The sense amplifier circuit 30 includes a plurality of sense amplifiers 36, with only one shown in the simplified illustration of FIG. 1. The sense amplifiers 36 are actuated for operation in response a sense amplifier enable (SAEN) signal generated by the sense amplifier enable generator circuit 10. The sense amplifier enable generator circuit 10 is coupled to the dummy bit line DBL and functions to sense the voltage on the dummy bit line DBL. In response to row decoder assertion of the signal on the dummy word line DWL (reference 50, FIG. 2), the dummy memory cell 22 is configured to discharge the dummy bit line DBL. As a result, the voltage on the dummy bit line DBL falls (reference 52, FIG. 2). The sense amplifier enable generator circuit 10 compares the falling voltage on the dummy bit line DBL to a threshold voltage, and when that threshold voltage is crossed the sense amplifier enable generator circuit 10 asserts the SAEN signal (reference 54, FIG. 2) and actuates the plurality of sense amplifiers 36 in the sense amplifier circuit 30. The threshold voltage is selected to ensure a sufficient time delay between assertion of the word line signals WL and DWL and crossing of the threshold so that such actuation of the sense amplifier circuit does not occur until such time as the data signals on the bit lines BL, BLB coupled to memory cell 20 have fully developed.

The column multiplexing circuit 32 is controlled to selectively connect bit line pairs to the sense amplifiers 36 of the sense amplifier circuit 30 by a column decoder circuit 40 in response to the decoded address ADD. The configuration and operation of column multiplexed memory circuits is well known to those skilled in the art.

Reference is now made to FIG. 3 showing additional circuit details for the sense amplifier enable generator circuit 10. The sense amplifier enable generator circuit 10 functions also to precharge the dummy bit line DBL. A control circuit 60 applies a precharge signal PRE to the gate of a MOS transistor 62 having a source terminal coupled to a supply node (vdd) and a drain terminal coupled to the dummy bit line DBL. In response to assertion logic low of the precharge signal PRE (reference 56, FIG. 2), the MOS transistor 62 turns on and pulls the dummy bit line DBL up to the supply node (vdd) voltage. This precharge operation occurs prior to a read of the memory. When the precharge signal PRE is deasserted (reference 58, FIG. 2), the voltage on the dummy bit line DBL may then be discharged in response to the assertion of the signal on the dummy word line DWL (reference 50, FIG. 2).

A comparator circuit 64 has a first input connected to the dummy bit line DBL and a second input connected to receive the threshold voltage. The comparator circuit 64 functions to compare the voltage on the dummy bit line DBL to the threshold voltage. The voltage on the dummy bit line DBL falls (reference 52, FIG. 2) in response to assertion of the dummy word line DWL signal. When the voltage on the dummy bit line DBL falls below the threshold voltage, the output of the comparator circuit 64 changes logic state and the SAEN signal is asserted (reference 54, FIG. 2).

As discussed above, the memory circuit may operate at a plurality of supply voltages. The operation shown in FIG. 2 and described above is representative of the operation of the memory circuit when supplied with a relatively high supply voltage (for example, 1.26V). When supplied with a relatively low supply voltage (for example, 0.6V), the precharge voltage on the dummy bit line DBL will be correspondingly lower, but the threshold voltage will remain the same. As noted above, there is a large degradation of the worst bitcell (for example, six sigma away from nominal due to local statistical variation) at the lower supply voltage. Because of this, the delay generated by the sense amplifier enable generator circuit 10 is not tracked from higher to lower supply voltage. The discharge time for the dummy bit line DBL will degrade with reduction of the supply voltage. However, the dummy memory cell 22 only tracks the nominal case rather than the worst case. As a result, when operating at the lower supply voltage, the output of the comparator circuit 64 may change logic state too soon and the SAEN signal may be asserted too early. If this occurs, there is a risk that the sense amplifier 36 will be enabled prior to the time when the data signals on the bit lines BL, BLB have fully developed. An incorrect read of the data for data output from the sense amplifier 36 may then occur.

The prior art teaches a number of solutions to the foregoing problem. In one solution, the memory circuit slows the discharge rate of the dummy bit line DBL using an added charged capacitance when operating at the relatively low supply voltage. A switching circuit, such as a pass gate, is typically used to selectively connect the added capacitance when operating in low supply voltage mode, but this pass gate is somewhat resistive and this circuitry adversely affects operation to fully discharge the dummy bit line. In another solution, the memory circuit logically delays the SAEN signal using a multiplexer circuit when operating at the relatively low supply voltage. However, there is no correlation between the degradation over time of the logic delay and the degradation over time of the memory cells. So, as the memory circuit ages, proper timing of the assertion of the SAEN signal relative to the full development of the data signals on the bit lines BL, BLB cannot be assured.

There is a need in the art to provide a better solution.

SUMMARY

In an embodiment, a sense amplifier enable signal generating circuit comprises: an input coupled to a dummy bit line of a memory; a voltage comparator circuit configured to compare a voltage on the dummy bit line to a threshold voltage and generate an output signal in response thereto; a multi-bit counter circuit configured to count a count value in response to the output signal; a pull-up circuit configured to pull up the voltage on the dummy bit line in response to the output signal; and a count comparator circuit configured to compare the count value to a count threshold and generate a sense amplifier enable signal in response thereto.

In an embodiment, a sense amplifier enable signal generating circuit comprises: an input coupled to a dummy bit line of a memory; a first circuit configured to selectively pull up a voltage on the dummy bit line in response to the voltage on the dummy bit line falling below a first threshold; a second circuit configured to count a number of times the voltage on the dummy bit line falls below the first threshold; and a third circuit configured to generate a sense amplifier enable signal in response to the counted number of times meeting a second threshold.

In an embodiment, a method comprises: sensing a falling voltage on a dummy bit line of a memory in response to assertion of a word line signal; selectively pulling up the voltage on the dummy bit line in response to the voltage falling below a first threshold; counting a number of times the voltage on the dummy bit line falls below the first threshold; and generating a sense amplifier enable signal in response to the counted number of times meeting a second threshold.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
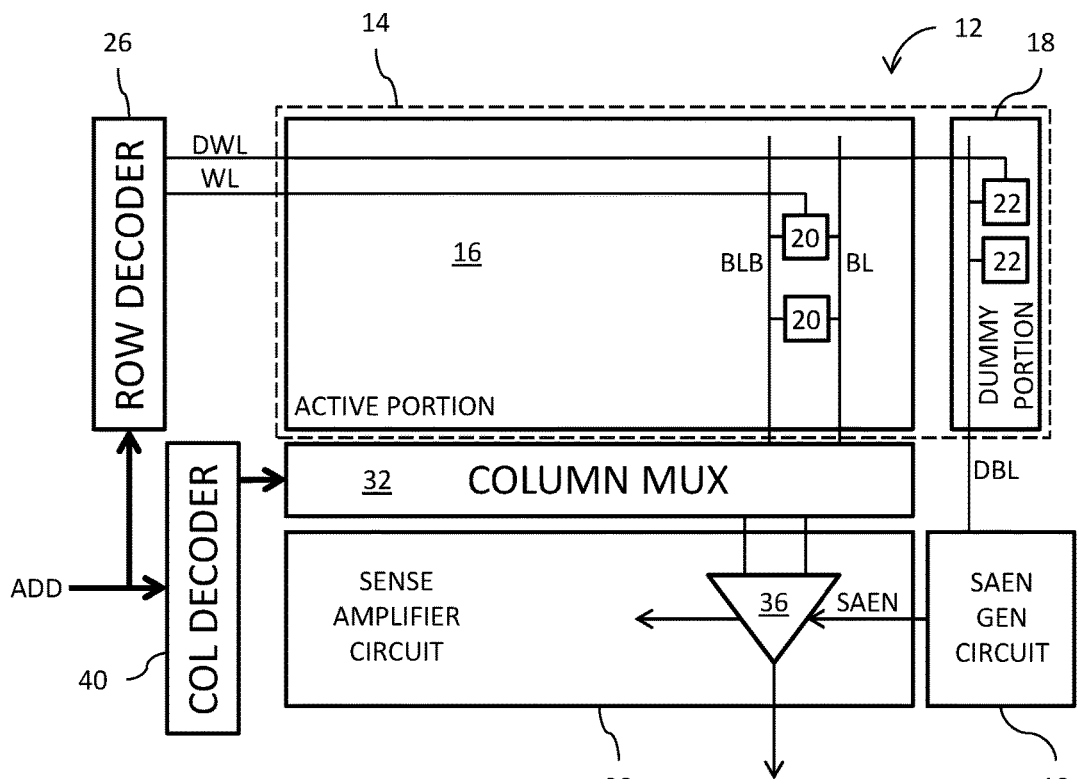
FIG. 1 is a block diagram for a prior art self-timing solution for a sense amplifier enable generator circuit used within an integrated memory circuit.
Figure 3:
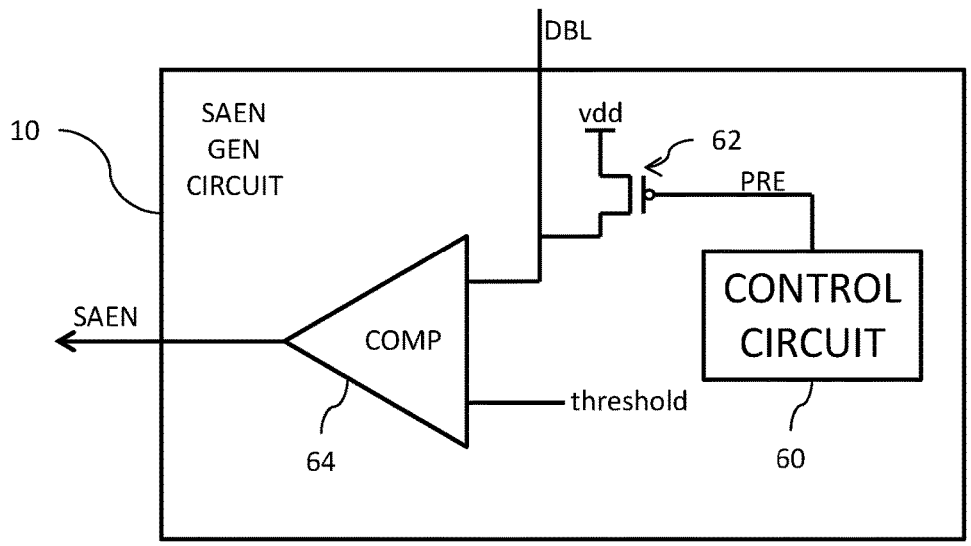
FIG. 3 is a block diagram for a sense amplifier enable generator circuit.
Figure 4:
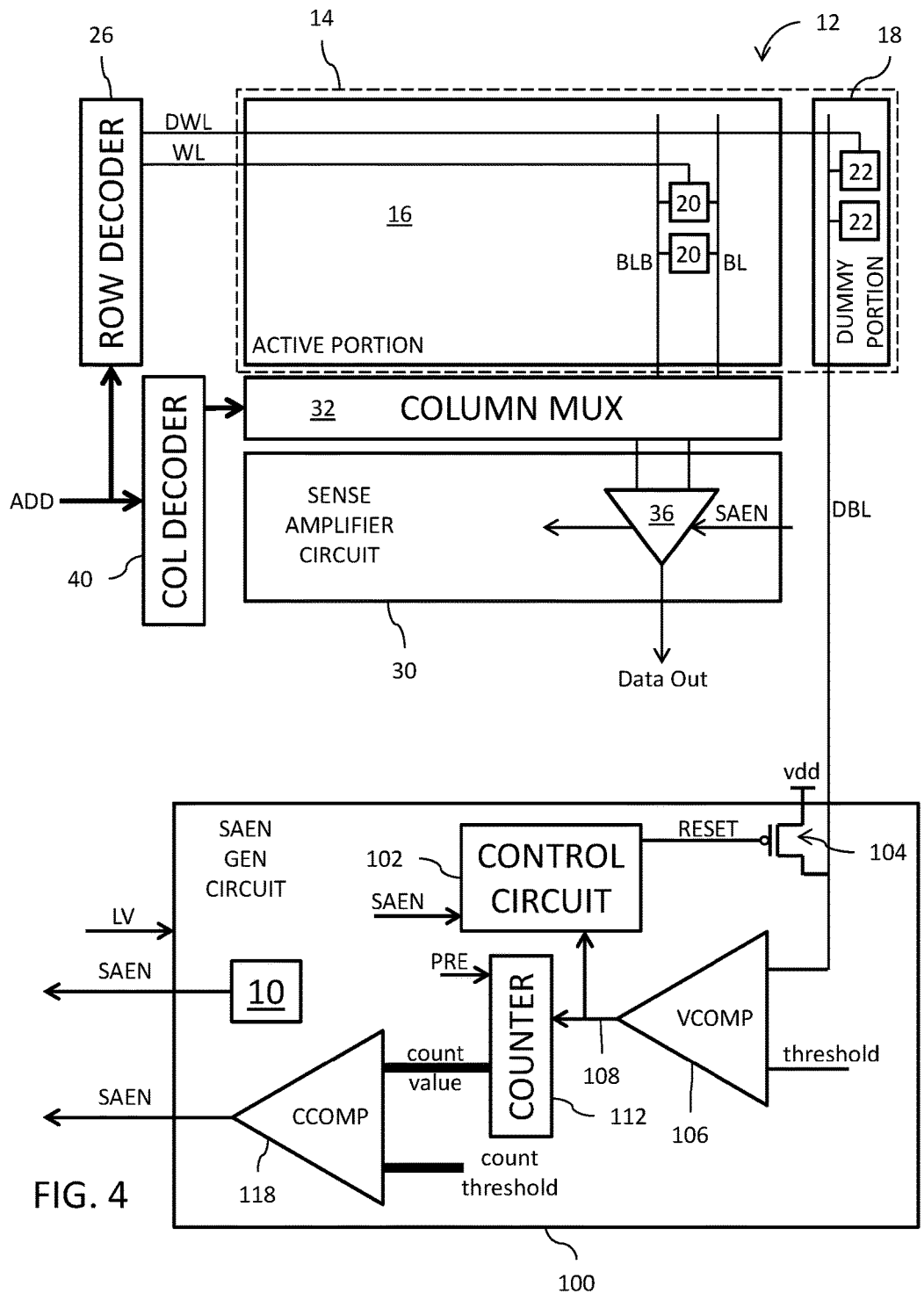
FIG. 4 is a block diagram for a self-timing solution for a sense amplifier enable generator circuit used within an integrated memory circuit.

Reference is now made to FIG. 4 showing a block diagram for a self-timing solution for a sense amplifier enable generator circuit used within an integrated memory circuit. Like reference numbers refer like components as shown in FIG. 1, the description of FIG. 1 being incorporated by reference. The implementation of FIG. 4 differs from the implementation of FIG. 1 primarily with respect to the configuration and operation of the sense amplifier enable generator circuit (here, reference 100). The sense amplifier enable generator circuit 100 may include the circuit (reference 10, see FIG. 3) as discussed above for the generation of the SAEN signal when the memory circuit is operating with the relatively high supply voltage.

The sense amplifier enable generator circuit 100 receives a control signal LV indicative of whether the memory circuit is operating with the relatively low supply voltage. When the control signal LV is not asserted, and operation is made with respect to the relatively high supply voltage, the circuit 10 is enabled for operation to generate the SAEN signal as described above. Conversely, when the control signal LV is asserted, and operation is made with respect to the relatively low supply voltage, the circuitry of the sense amplifier enable generator circuit 100 shown in FIG. 4 is enabled for operation to generate the SAEN signal. It will be understood that the circuits 10 and 100 may, where possible, share circuit components.

The sense amplifier enable generator circuit 100 functions to selectively reset the charge on the dummy bit line DBL. A control circuit 102 applies a reset signal RESET to the gate of a MOS transistor 104 having a source terminal coupled to a supply node (vdd) and a drain terminal coupled to the dummy bit line DBL. In response to assertion logic low of the reset signal RESET, the MOS transistor 104 turns on and pulls the dummy bit line DBL up to the supply node (vdd) voltage.

A comparator circuit (VCOMP) 106 has a first input connected to the dummy bit line DBL and a second input connected to receive the threshold voltage. The comparator circuit 106 functions to compare the voltage on the dummy bit line DBL to the threshold voltage. When the voltage on the dummy bit line DBL falls below the threshold voltage, the output signal 108 of the comparator circuit 106 changes logic state.

A multi-bit counter circuit 112 has a reset input coupled to receive the precharge signal PRE and a clock input coupled to receive the output signal 108 from the comparator circuit 106. In response to assertion of the precharge signal PRE, the multi-bit counter circuit 112 is reset to a reset (or starting) value. With each assertion of the output signal 108, occurring when the voltage on the dummy bit line DBL falls below the threshold voltage, the multi-bit counter circuit 112 changes the stored count value. For example, if the multi-bit counter circuit 112 is configured as an incrementing counter, the stored count value is incremented in response to assertion of the output signal 108. Conversely, if the multi-bit counter circuit 112 is configured as a decrementing counter, the stored count value is decremented in response to assertion of the output signal 108.

A multi-bit count comparator circuit (CCOMP) 118 has a first input configured to receive the stored count value output from the multi-bit counter circuit 112 and a second input configured to receive a count threshold value. The comparator circuit 118 functions to compare the stored count value to the count threshold value. When the stored count value equals the count threshold value, the output of the comparator circuit 118 changes logic state and the SAEN signal is asserted.

Figure 5:
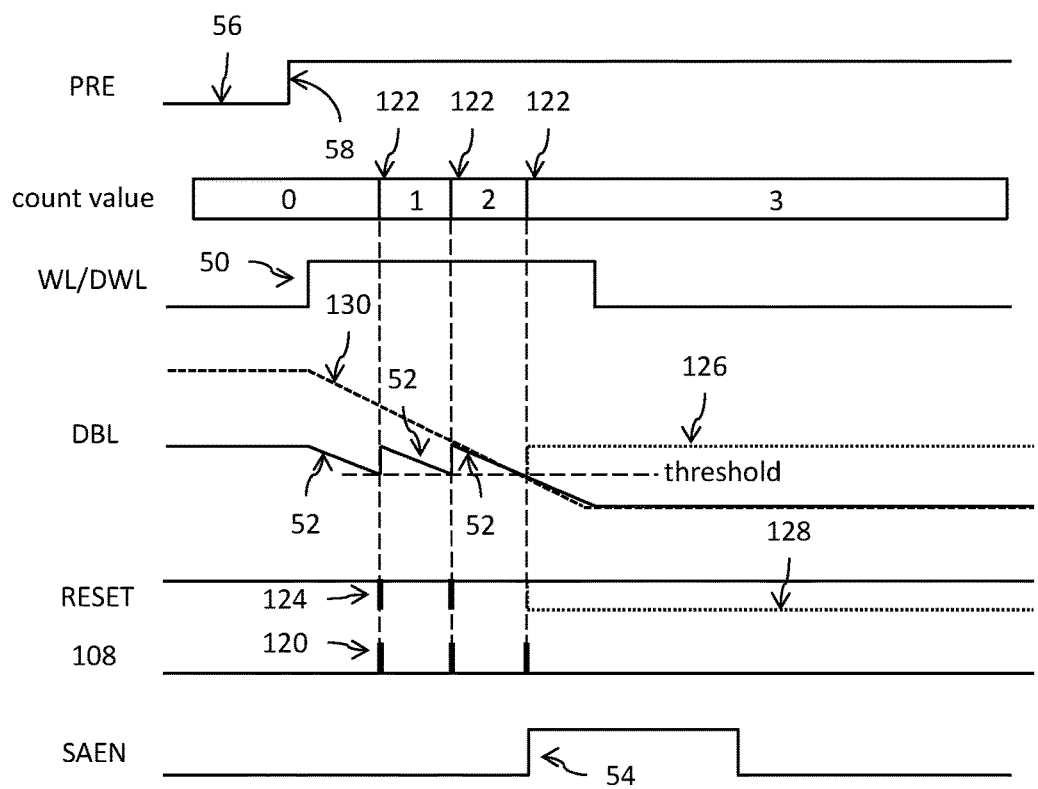
FIG. 5 is a timing diagram for operation of the circuitry of FIG. 4.

Operation of the sense amplifier enable generator circuit 100 may be better understood with reference to the timing diagram of FIG. 5. In the following description, it is assumed that the control signal LV is asserted and the memory circuit is operating with respect to the relatively low supply voltage.

The control circuit 60/102 applies a precharge signal PRE to the gate of the MOS transistor 62 in circuit 10. In response to assertion logic low of the precharge signal PRE (reference 56), the MOS transistor 62 turns on and pulls the dummy bit line DBL to the supply node (vdd) voltage. This precharge operation occurs prior to a read of the memory.

The assertion of the precharge signal PRE further causes the multi-bit counter circuit 112 to reset to a reset (or starting) value. In this example, the reset value is zero and the multi-bit counter circuit 112 operates as an incrementing counter. The precharge signal PRE is then deasserted (reference 58).

Next, the signal on the dummy word line DWL is asserted (reference 50). The voltage on the dummy bit line DBL then begins to discharge (reference 52). When the voltage on the dummy bit line DBL falls below the threshold voltage, the output of the comparator circuit 106 changes logic state. For example, the output signal 108 may pulse 120 when the comparison test is satisfied.

In response to the change in state of the output signal 108, the multi-bit counter circuit 112 increments (reference 122). The comparator circuit 118 compares the stored count value output from the multi-bit counter circuit 112 to the count threshold value. If the stored count value does not equal the count threshold value, the SAEN signal output from the comparator circuit 118 remains deasserted.

Furthermore, in response to the change in state of the output signal 108, and the deasserted SAEN signal, the control circuit 102 asserts the reset signal RESET (reference 124, for example, pulsing logic low). The MOS transistor 104 turns on and pulls the dummy bit line DBL back up to the supply node (vdd) voltage.

The process then repeats as described above as many times as necessary until the stored count value equals the count threshold value. In this example, the count threshold value is three. When the stored count value equals the count threshold value, the SAEN signal output from the comparator circuit 118 is asserted. Because the SAEN signal is asserted, the control circuit 102 may be configured to not assert the reset signal RESET.

In an alternative embodiment, the control circuit 102 will assert the reset signal RESET at this point which causes the MOS transistor 104 to turn on and pull the dummy bit line DBL back up to the supply node (vdd) voltage, effectively precharging the dummy bit line DBL in anticipation of the next read cycle. This operation is shown by dotted lines 126 and 128. In this regard, in an embodiment a same transistor may be used for the MOS transistor 62, 104.

For comparison purposes, the operation of the circuit 10/100 when the control signal LV is deasserted and the memory circuit is operating with respect to the relatively high supply voltage is shown by dotted line 130. In this implementation, the sense amplifier enable generator circuit 100 is disabled and the sense amplifier enable generator circuit 10 is enabled. When the comparator 64 detects that the voltage on the dummy bit line DBL circuitry falls below the threshold voltage, the output of the comparator circuit 64 will change logic state and the SAEN signal will be asserted (reference 54). It will be noted that the illustrated example of FIG. 5, the timing of the assertion of the SAEN signal is substantially the same in both the low and high voltage modes of operation.

In another embodiment, the sense amplifier enable generator circuit 10 may be omitted. In this configuration, when the control signal LV is deasserted and the memory circuit is operating with respect to the relatively high supply voltage, the count threshold value may be set to a value of one. Conversely, when the control signal LV is asserted and the memory circuit is operating with respect to the relatively low supply voltage, the count threshold value may be set to a value greater than one (for example, three as shown in the example described above) so as to delay the assertion of the SAEN signal.

Figure 2:
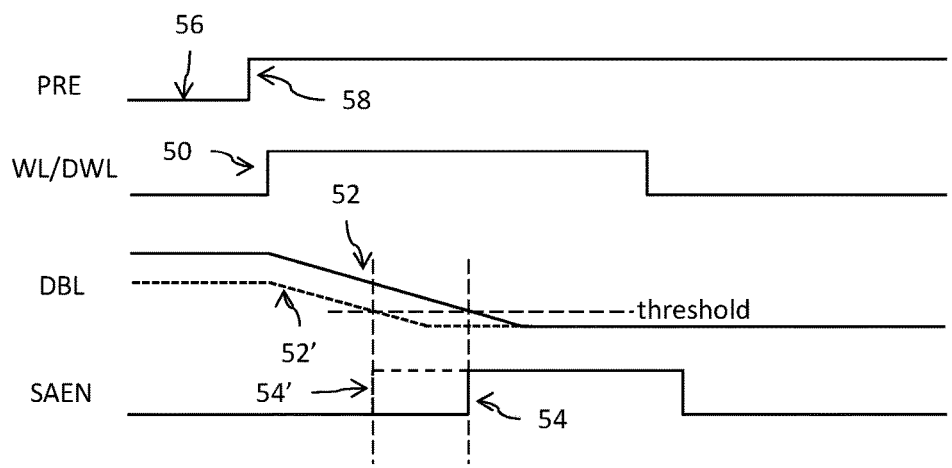
FIG. 2 is a timing diagram for operation of the circuitry of FIG. 1.

An advantage of the implementation of FIGS. 4 and 5 over the implementation of FIGS. 1-3 is that the amount of delay can be tuned by the setting of the count threshold value. This value may, for example, be loaded into a register of the memory circuit. Additionally, the value may be adjusted over time to account for changes in the memory circuit due to aging. Mismatch between the delay for SAEN assertion and memory cell discharge (i.e., full development of the data signals on the bit lines BL, BLB) is avoided. Complete control over the delay timing is exercised simply and accurately by adjustment of the stored count threshold value.

In yet another alternative embodiment, only the sense amplifier enable generator circuit 100 is provided and the control signal LV is used to select the count threshold value based on the of supply voltage level. For example, the count threshold value may have a relatively low value (for example, one) when the control signal LV indicates operation with respect to the relatively high supply voltage, and conversely may have a relatively high value (for example, three as shown above) when the control signal LV indicates operation with respect to the relatively low supply voltage.

Although the example above addresses operation with only two distinct supply voltage levels, it is understood that memory circuits may be implemented with three or more supply voltage levels and corresponding operating modes. The implementation of FIGS. 4 and 5 can handle differences in timing with respect to any number of supply voltage levels because correct timing operation can be assured by simply setting the proper count threshold value corresponding to the actuated supply voltage level. Different count threshold values can be stored in different registers or memory spaces and selected for use based on the current supply voltage mode.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A sense amplifier enable signal generating circuit, comprising:
   an input coupled to a dummy bit line of a memory;
   a voltage comparator circuit configured to compare a voltage on the dummy bit line to a threshold voltage and generate an output signal in response thereto;
   a multi-bit counter circuit configured to count a count value in response to the output signal;
   a pull-up circuit configured to pull up the voltage on the dummy bit line in response to the output signal; and
   a count comparator circuit configured to compare the count value to a count threshold and generate a sense amplifier enable signal in response thereto.

2. The circuit of claim 1, wherein the multi-bit counter circuit is an incrementing counter and the count value is incremented in response to the output signal, and wherein the count comparator circuit generates the sense amplifier enable signal when the incremented count value reaches a threshold count value.

3. The circuit of claim 1, wherein the multi-bit counter circuit is a decrementing counter and the count value is decremented in response to the output signal, and wherein the count comparator circuit generates the sense amplifier enable signal when the decremented count value reaches a threshold count value.

4. The circuit of claim 1, wherein the multi-bit counter circuit is configured to reset to a starting count value in response to a precharging of the dummy bit line.

5. The circuit of claim 1, wherein the pull-up circuit is further configured to pull up the voltage on the dummy bit line to precharge the dummy bit line in advance of a read operation on the memory.

6. The circuit of claim 1, wherein a value of the count threshold is dependent on a supply voltage level for the memory.

7. The circuit of claim 1, wherein a value of the count threshold is selected in response to a signal indicative of a supply voltage level for the memory.

8. A sense amplifier enable signal generating circuit, comprising:
   an input coupled to a dummy bit line of a memory;
   a first circuit configured to selectively pull up a voltage on the dummy bit line in response to the voltage on the dummy bit line falling below a voltage threshold;
   a second circuit configured to increment or decrement a count value each time the voltage on the dummy bit line falls below the voltage threshold; and
   a third circuit configured to generate a sense amplifier enable signal in response to the count value meeting a count threshold.

9. The circuit of claim 8, wherein the second circuit increments or decrements said count value during a time period when a word line of the memory is asserted.

10. The circuit of claim 8, wherein the first circuit repeatedly selectively pulls up during a time period when a word line of the memory is asserted.

11. The circuit of claim 8, wherein said count value is reset to a starting count value in response to a precharging of the dummy bit line.

12. The circuit of claim 8, wherein said first circuit is further configured to pull up the voltage on the dummy bit line to precharge the dummy bit line in advance of a read operation on the memory.

13. The circuit of claim 8, wherein a value of the count threshold is dependent on a supply voltage level for the memory.

14. The circuit of claim 8, wherein a value of the count threshold is selected in response to a signal indicative of a supply voltage level for the memory.

15. A method, comprising:
   sensing a falling voltage on a dummy bit line of a memory in response to assertion of a word line signal;
   selectively pulling up the voltage on the dummy bit line in response to the voltage falling below a voltage threshold;
   counting, during a time period when a word line of the memory is asserted, a number of times the voltage on the dummy bit line falls below the voltage threshold; and
   generating a sense amplifier enable signal in response to the counted number of times meeting a count threshold.

16. The method of claim 15, further comprising resetting the count to a starting count value in response to a precharging of the dummy bit line.

17. The method of claim 15, further comprising pulling up the voltage on the dummy bit line to precharge the dummy bit line in advance of a read operation on the memory.

18. The method of claim 15, wherein a value of the second threshold is dependent on a supply voltage level for the memory.

19. The method of claim 15, wherein a value of the second threshold is selected in response to a signal indicative of a supply voltage level for the memory.

20. A sense amplifier enable signal generating circuit, comprising:
   an input coupled to a dummy bit line of a memory;
   a first circuit configured to selectively pull up a voltage on the dummy bit line in response to the voltage on the dummy bit line falling below a first threshold;
   a second circuit configured to count, during a time period when a word line of the memory is asserted, a number of times the voltage on the dummy bit line falls below the first threshold; and
   a third circuit configured to generate a sense amplifier enable signal in response to the counted number of times meeting a second threshold.

21. The circuit of claim 20, wherein the first circuit repeatedly selectively pulls up during a time period when the word line of the memory is asserted.

22. The circuit of claim 20, wherein said count is reset to a starting count value in response to a precharging of the dummy bit line.

23. The circuit of claim 20, wherein said first circuit is further configured to pull up the voltage on the dummy bit line to precharge the dummy bit line in advance of a read operation on the memory.

24. The circuit of claim 20, wherein a value of the second threshold is dependent on a supply voltage level for the memory.

25. The circuit of claim 20, wherein a value of the second threshold is selected in response to a signal indicative of a supply voltage level for the memory.

26. A method, comprising:
   resetting a count to a starting count value in response to a precharging of a dummy bit line of a memory;

sensing a falling voltage on the dummy bit line in response to assertion of a word line signal;

selectively pulling up the voltage on the dummy bit line in response to the voltage falling below a first threshold;

counting a number of times the voltage on the dummy bit line falls below the first threshold; and generating a sense amplifier enable signal in response to the counted number of times meeting a second threshold.

27. The method of claim 26, further comprising pulling up the voltage on the dummy bit line to precharge the dummy bit line in advance of a read operation on the memory.

28. The method of claim 26, wherein a value of the second threshold is dependent on a supply voltage level for the memory.

29. The method of claim 26, wherein a value of the second threshold is selected in response to a signal indicative of a supply voltage level for the memory.

* * * * *